United States Patent

Cresswell et al.

[11] 3,990,091
[45] Nov. 2, 1976

[54] LOW FORWARD VOLTAGE DROP THYRISTOR

[75] Inventors: Michael W. Cresswell, Pittsburgh; John S. Roberts, Export, both of Pa.

[73] Assignee: Westinghouse Electric Corporation, Pittsburgh, Pa.

[22] Filed: Jan. 10, 1975

[21] Appl. No.: 540,208

Related U.S. Application Data

[63] Continuation of Ser. No. 354,620, April 25, 1973, abandoned.

[52] U.S. Cl. .................................. 357/38; 357/29; 357/64; 357/86; 357/90; 148/1.5
[51] Int. Cl.² ...................... H01L 29/74; H01L 7/00
[58] Field of Search ................. 357/38, 39, 29, 64, 357/86, 90

[56] References Cited
UNITED STATES PATENTS

| | | |
|---|---|---|
| 3,246,172 | 4/1966 | Sanford ................................. 357/38 |
| 3,390,020 | 6/1968 | Mandelkorn ........................... 357/29 |
| 3,442,722 | 5/1969 | Bauerlein et al. ....................... 357/38 |
| 3,470,036 | 9/1969 | Svedberg ............................... 357/38 |
| 3,532,910 | 10/1970 | Lee et al. ............................... 357/29 |
| 3,881,964 | 5/1975 | Cresswell et al. ....................... 357/38 |

Primary Examiner—Andrew J. James
Assistant Examiner—Joseph E. Clawson, Jr.
Attorney, Agent, or Firm—C. L. Menzemer

[57] ABSTRACT

A thyristor is provided with a low forward voltage drop ($V_f$) while providing a typical gate current to trigger ($I_g$). The working point in the cathode-base region of the thyristor has an impurity concentration less than $5 \times 10^{15}$ and preferably less than $1 \times 10^{15}$ per cm³. The gating portion of the device is selectively irradiated, preferably with electron radiation, to maintain the gate current. The forward blocking voltage ($V_{BO}$) and rate of rise of application of forward voltage (dV/dt) of the thyristor may also be maintained at typical values by a fine shunt pattern and/or doping of the shunt portions.

6 Claims, 7 Drawing Figures

LOW FORWARD VOLTAGE DROP THYRISTOR

This is a continuation, of application Ser. No. 354,620 filed Apr. 25, 1973 now abandoned.

FIELD OF THE INVENTION

The present invention relates to semiconductor devices and particularly thyristors.

BACKGROUND OF THE INVENTION

Thyristors are non-linear solid state devices that are bistable; that is, they have both a high and a low impedance state. They are commonly four layer PNPN structures. Thyristors are usually switched from one impedance state to the other by means of a control or gating signal applied to one of the base regions.

The gate sensitivity of a semiconductor device is by definition inversely dependent on the gate current needed to fire the device. Gate current is in turn a function of the injection efficiency ($\gamma$) into the cathode-base region and the carrier lifetime ($\tau$) in said base region of the device. Both of these parameters are affected by the impurity concentration ($N_A$) in the base region. Thus, the gate current can be decreased and gate sensitivity increased by decreasing the cathode-base impurity concentration. Conversely, increasing the base impurity concentration to decrease gate sensitivity increases the forward voltage drop. Design of a gated semiconductor device has therefore routinely involved a trade-off between gate current and forward voltage drop requirements.

To provide this trade-off, a gallium diffusion has typically been made prior to diffusion of the cathode-emitter region. The purpose of this second cathode-base diffusion (the first usually being aluminum) is to lessen the injection efficiency of the emitter-base junction by raising the impurity concentration at the working point (see FIG. 3A). This practice prevents accidental firing of the device by stray currents in the gate circuit, the gate current to fire ($I_g$) usually being in excess of 10 milliamps. Referring to FIG. 3A, the diffusion is typically symmetric for convenience. The presence of the gallium diffusion on the anode-emitter region does not contribute significantly to the performance of the device since the regrown region, formed in making the ohmic contact to the anode-emitter region, is usually penetrated to where the aluminum is the dominant impurity.

To control gate sensitivity, it has also been known to selectively diffuse gold into the gating portion of the cathode-base, or selectively irradiating the gating portion of the cathode-base of the thyristor, see our application Ser. No. 283,685, filed Aug. 25, 1972 and now U.S. Pat. No. 3,840,887. Both of these techniques result in reducing the minority carrier lifetime in the base region. The gate current to fire ($I_g$) is thereby increased without increasing the forward voltage drop. Neither of these techniques resulted in a reduction of the forward voltage drop. To the contrary, irradiation of the conducting portion of a thyristor has been known to increase the forward voltage drop of the device, see our application Ser. No. 283,685, filed Aug. 25, 1972 and now U.S. Pat. No. 3,840,887. Also gold diffusion is known to increase the leakage current of the device.

The present invention overcomes these difficulties and disadvantages of the prior art. It provides a thyristor with a forward voltage drop lower than any heretofore attainable without the sacrifice of other critical parameters and particularly gate current to trigger ($I_g$).

SUMMARY OF THE INVENTION

A thyristor is provided with a low forward voltage drop ($V_f$) and a typical gate current to trigger ($I_g$). The working point of the cathode-emitter of the thyristor has an impurity concentration below $5 \times 10^{15}$ per $cm^3$ and preferably below $1 \times 10^{15}$ per $cm^3$, thereby providing low forward voltage drop. Typical gate current to fire is subsequently provided by selective irradiation of at least portions of the gating portion of the devices as more fully described in our co-pending application Ser. No. 283,685, filed Aug. 25, 1972 and now U.S. Pat. No. 3,840,887, while leaving the conducting portions substantially non-irradiated.

The lowering of the impurity concentration at the working point also increases the sensitivity of the rate of rise of application of forward voltage (dV/dt) and the forward blocking voltage ($V_{BO}$). Irradiation used to raise gate current requirements leaves essentially unchanged the rate of rise of application of forward blocking voltage and the forward blocking voltage capabilities. The rate of rise and forward blocking sensitivities can, however, be controlled independent of gate current by control of the shunt pattern, see Chu, "Geometry of Thyristor Cathode Shunts", IEEE Trans. on Electron Devices, Vol. ED-17, p. 687 (1970), and selective diffusion in the shunts to a depth less than the junction between the cathode-emitter and cathode base.

Other details, objects and advantages of the invention will become apparent as the following description of the present preferred emmbodiments and present preferred methods of practicing the same proceeds.

BRIEF DESCRIPTION OF THE DRAWINGS

In the accompanying drawings, the preferred embodiments of the invention and presently preferred methods of practicing the invention are illustrated in which.

DESCRIPTION OF THE PREFERRED EMBODIMENTS

Figure 1:
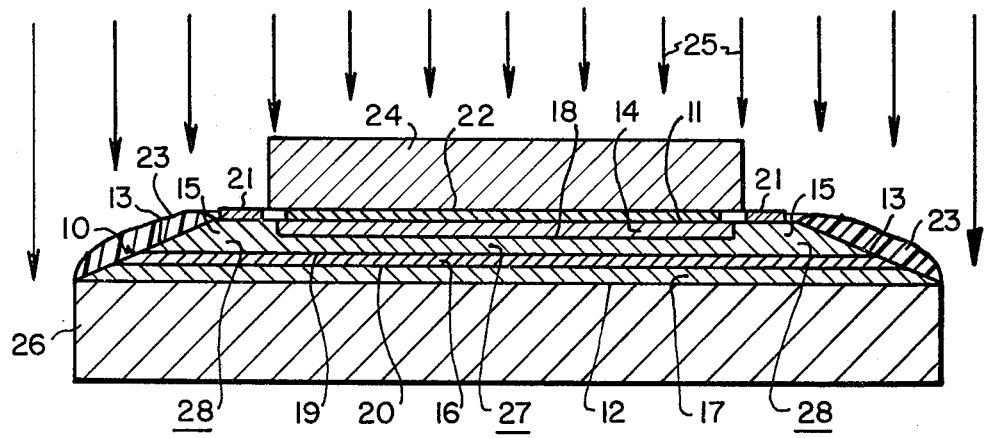
FIG. 1 is an elevational view in cross-section of an edge fired thyristor, without shunts shown, in accordance with the present invention.

Referring to FIG. 1, an edge fired silicon thyristor wafer or body 10 is shown having opposed major surfaces 11 and 12 and curvilinear side surfaces 13. The thyristor wafer 10 has cathode-emitter region 14 and anode-emitter region 17 of impurities of opposed conductivity type adjoining the major surfaces 11 and 12, respectively; and cathode-base region 15 and anode-base region 16 of impurities of opposite conductivity type in the interior of the wafer between emitter regions 14 and 17. The cathode-emitter region 14 and cathode-base region 15 are also of impurities of opposite conductivity type, as is anode-base region 16 and anode-emitter region 17. By this arrangement, thyristor wafer 10 is provided with a four layer impurity structure in which three PN junctions 18, 19 and 20 are provided.

The thyristor is provided with a periphery fired gate by adjoining cathode-base region 15 to the major surface 11 at outward portions thereof. Portions of cathode-base region 15 thus extends annularly around cathode-emitter region 14. To provide electrical connections to the thyristor, metal contacts 21 and 22 make ohmic contact to cathode-base region 15 and cathode-emitter region 14, respectively, at major surface 11; and metal substrate 26 makes ohmic contact to anode-emitter region 17 at major surface 12. Atmospheric effects on the thyristor operation are substantially reduced by coating side surfaces 13 with a suitable passivating resin 23 such as a silicone, epoxy or varnish composition.

Selective irradiation is performed on thyristor wafer 10 by masking conducting portions 27 of wafer 10 with a circular shield plate 24 and annularly irradiating gating portions 28 of wafer 10 with radiation 25. Shield plate 24 is mechanically positioned in contact with metal contact 22 to mask conducting portions 27 against radiation. Plate 24 is of any material of sufficient density and thickness to be opaque to the particular radiation used. For electron radiation, shield plate 24 may be standard, low carbon steel about ¼ inch thickness or tungsten or lead of about 5/32 inch thickness. After the radiation is completed, shield plate 24 is physically removed for reuse in subsequent irradiations.

Figure 2:
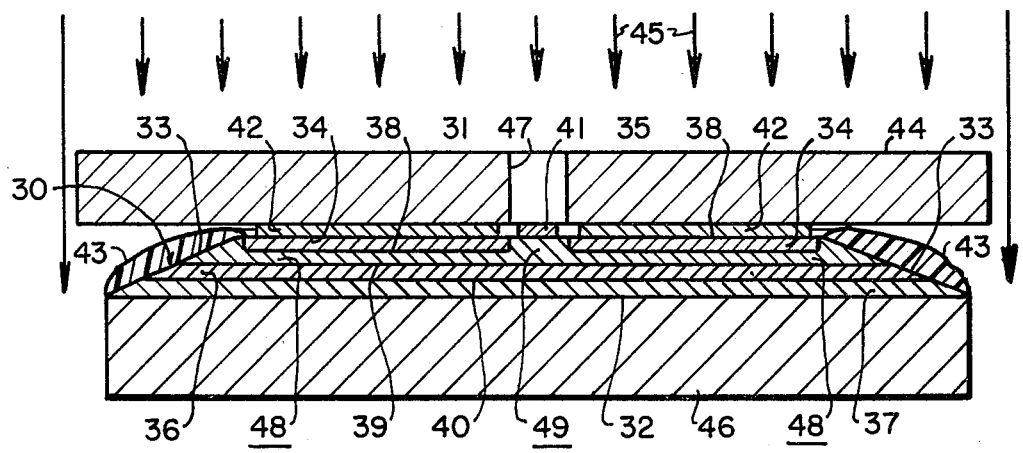
FIG. 2 is an elevational view in cross-section of a center fired thyristor, without shunts shown, in accordance with the invention.

Referring to FIG. 2, center fired silicon thyristor wafer or body 30 is shown having opposed major surfaces 31 and 32 and curvilinear side surfaces 33. the thyristor wafer 30 has cathode-emitter region 34 and anode-emitter region 37 of impurities of opposite conductivity type adjoining major surfaces 31 and 32, respectively; and cathode-base region 35 and anode-base region 36 of impurities of opposite conductivity type in the interior of the wafer between emitter regions 34 and 37. Cathode-emitter region 34 and cathode-base region 35 are also of opposite conductivity type of impurities as is anode-base region 36 and anode-emitter region 37. By this arrangement, thyristor wafer 30 is provided with a four layer impurity structure in which three PN junctions 38, 39 and 40 are provided.

The thyristor is provided with a center fired gate by adjoining cathode-base region 35 to the major surface 31 at center portions thereof. Cathode-emitter region 34 thus extends annularly around surface portions of region 35. To provide electrical connection to the thyristor wafer, metal contacts 41, 42 make ohmic contact to cathode-emitter region 34 and cathode-base region 35, respectively, at major surface 31; and metal substrate 46 makes ohmic contact to anode-emitter region 37 at major surface 32. Atmospheric effects on the thyristor operation are substantially reduced by coating side surfaces 33 with a suitable passivating resin 43 such as a silicone, epoxy or varnish composition.

Selective irradiation is performed on wafer 30 by masking conducting portions 48 of wafer 30 with annular shield plate 44 having a circular center opening 47 therein, and irradiating gating portions 49 of wafer 30 with radiation 45 through opening 47. Shield plate 44 is positioned by mechanically placing it in contact with metal contact 42 to mask conducting portions 48 against radiation while leaving gating portions 49 exposed. Plate 44 is of the same density and thickness as previously described for shield plate 24. After the radiation is completed, plate 44 is physically removed for reuse in subsequent irradiations.

Figure 3:
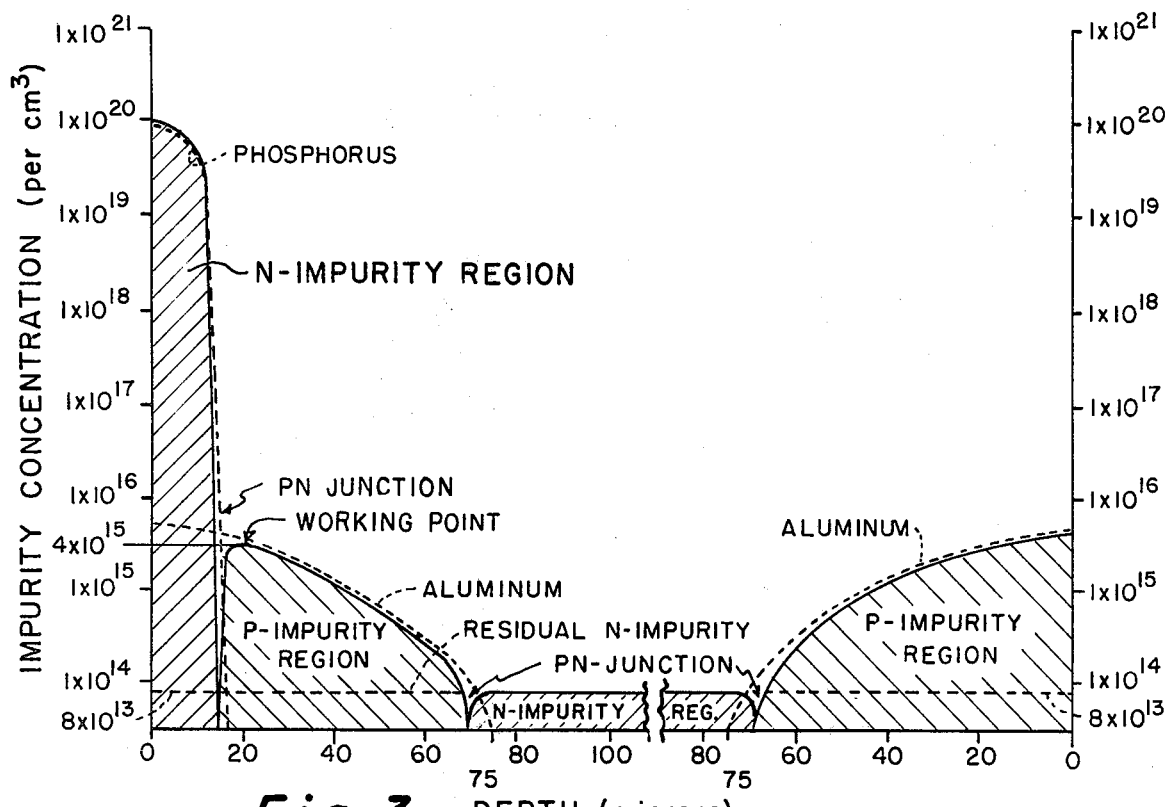
FIG. 3 is the impurity concentration as a function of depth of the thyristors shown in FIGS. 1 and 2.

Referring to FIG. 3, the impurity concentration profiles are shown for the conducting portions of the thyristors shown in FIGS. 1 and 2. The silicon bodies with an N-type impurity concentration were symmetrically diffused with aluminum by standard techniques to form the PNP structure comprising the base regions and the anode-emitter region. The aluminum was diffused to a depth of about 75 microns while maintaining a surface concentration of $6 \times 10^{15}$ per $cm^3$. This is generally accomplished by driving the impurity by heating in an inert atmosphere after the initial diffusion step.

One of the major surfaces of the body is then masked and the opposing major surface is selectively masked. A high concentration selective cathode-emitter diffusion is then performed through the windows in the mask on the opposing major surface. The diffusion was performed by a typical open-tube diffusion system with phosphorus oxytrichloride ($POCl_3$) as a constant-diffusion source. The emitter diffusion is to a depth of about 15 microns with a surface concentration of about $1 \times 10^{20}$ per $cm^3$.

The resulting working point is shown to have a working point of between about $2 \times 10^{15}$ to $4 \times 10^{15}$ per $cm^3$. For purposes of definition, as FIG. 3 shows, the working point is the point of highest (uncompensated) impurity concentration in the cathode-base region. It is situated adjacent the PN junction formed between the cathode-base region and the cathode-emitter region. As before, the low concentration of aluminum in the anode-emitter region is increased to an appropriate depth by alloying of the ohmic contact.

Figure 3A:
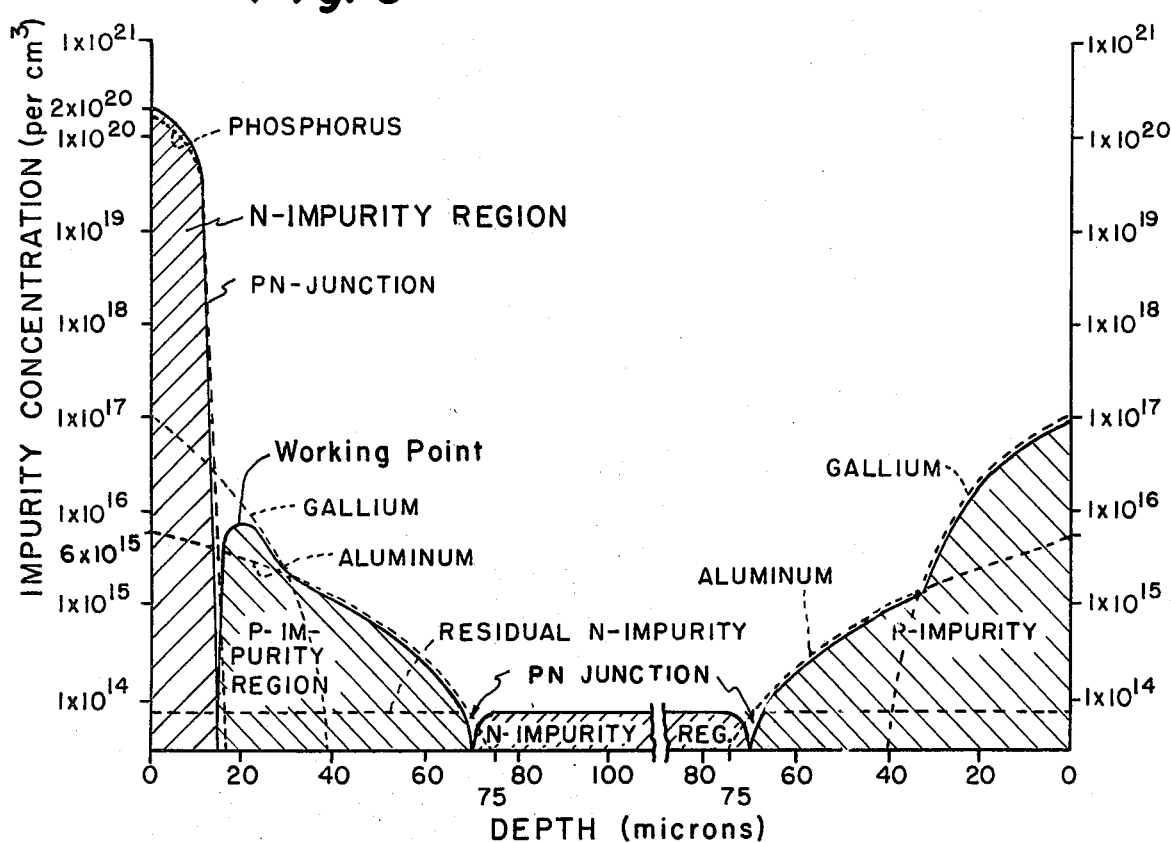
FIG. 3A is the impurity concentration as a function of depth of a prior art thyristor for comparison.

The result of the present invention in reducing forward voltage drop is shown by comparison with FIG. 3A. There a gallium diffusion is performed prior to diffusion of the cathode-emitter region to reduce the injection efficiency of the cathode-emitter region and in turn reduce the gate sensitivity. This raises the working point to about $5 \times 10^{16}$ per $cm^3$, as shown, or more typically about 1 to $2 \times 10^{17}$ per $cm^3$, see Chu, IEEE Trans. on Electron Devices, Vol. ED-17, No. 9, p. 687 (Sept., 1970). However, this rise also increases the forward voltage drop. It should also be noted that the gallium diffusion is typically symmetric for convenience; this does not enter into the operation of the anode-emitter because the alloying in forming the ohmic contact to the anode-emitter region usually penetrates to a depth beyond the galliium diffusion.

Whether edge fired or center fired, electron radiation is preferably used as the radiation source because of availability and inexpensiveness. Moreover, electron radiation (or gamma radiation) may be preferred in some applications where the damage desired in the semiconductor lattice is to single atoms and small groups of atoms. This is in contrast to neutron and proton radiation which causes large disordered regions of as many as a few hundred atoms in the semiconductor crystal. The latter type radiation source may, however, be preferred in certain applications because of its better defined range and better controlled depth of lattice damage. It is anticipated that any kind of radiation may be appropriate provided it is capable of bombarding and disrupting the atomic lattice to create energy levels substantially decreasing carrier lifetimes without correspondingly increasing the carrier generation rate.

Electron radiation is also preferred over gamma radiation because of its availability to provide adequate dosages in a commercially practical time. For example, a $1 \times 10^{12}$ electrons/cm$^2$ dosage of 2 Mev electron radiation will result in approximately the same lattice damage as that produced by a $1 \times 10^6$ rads dosage of gamma radiation; and a $1 \times 10^{14}$ electrons/cm$^2$ dosage of 2 Mev electron radiation would result in approximately the same lattice damage as that produced by a $1 \times 10^8$ rads dosage of gamma radiation. Such dosages of gamma radiation, however, would entail several weeks of irradiation, while such dosages can be supplied by electron radiation in minutes.

Further, it is preferred that the radiation level of electron radiation be greater than 1 Mev and most desirably greater than 2 Mev. Lower level radiation is generally believed to result in substantial elastic collisions with the atomic lattice and, therefore, does not provide enough damage to the lattice in commercially feasible times.

To provide appropriate radiation, it has been found that radiation dosages above $1 \times 10^{13}$ electrons/cm$^2$ are preferred and that radiation dosages about $3 \times 10^{13}$ electrons/cm$^2$ are most desired. Lower dosage levels have not been found to affect significant reductions in turn-off times. Conversely, it is preferred that the radiation dosage does not exceed about $2 \times 10^{14}$ electrons/cm$^2$ so that the forward voltage drop of the thyristor can be maintained within marketably desired limits.

To illustrate the invention, 54 ohm-cm, N-type 14 mil silicon semiconductor wafers were diffused with aluminum in vacuum as above described to form the base regions and the anode emitter region. The aluminum was diffused to a depth of about 52 microns with a surface concentration of about $7 \times 10^{15}$ per cm$^3$. A high concentration phosphorus emitter diffusion was then performed in an open-tube diffusion system with POCl$_3$ as the diffusion souce in an oxygen-argon atmosphere. The phosphorus was diffused to a depth of about 12 microns with a surface concentration of about $9 \times 10^{19}$ per cm$^3$. A 1.5-mil thick aluminum foil was thereafter alloyed into the anode-emitter region to provide good ohmic contact with a molybdenum anode. After etching, aluminum was evaporated and sintered on the other side of the wafer to make ohmic contacts to the cathode-emitter and cathode-base regions.

The resulting thyristors were measured for thickness and found to be between 13.1 and 13.7 microns with average thickness of 13.5 mils (337 microns). The resistivity profile of the devices were then measured using the well-known spreading resistance technique verifying the above-stated impurity concentrations and depths. The anode-base region was found to average about 233 microns, the cathode-base region was found to average about 40 microns, and the cathode-emitter region was found to average about 12 microns. The working point in the cathode-base was measured at about 6.5 ohm-cms ($\sim 2.0 \times 10^{15}$ per cm$^3$).

The electrical characteristics of the thyristors were also measured. The results are shown in Table I.

TABLE I

| Device No. | Ig ma | Vg volts | $V_F$ at 625 amps | $V_F$ at 1000 amps | Dynamic $V_F$ at 10 ms | 25° C. $V_{BO}$[1] volts | 25° C. $V_R$ volts | 125° C. $V_{BO}$ volts | 125° C. $V_R$ volts | dV/dt[2] V/μsec. |
|---|---|---|---|---|---|---|---|---|---|---|
| 1 | 0 | 0.08 | 1.25 | 1.41 | 3.8 | 0 | 1650 | 0 | 2000 | — |
| 2 | 2 | 0.75 | 1.20 | 1.39 | 3.5 | 500 | 800 | 0 | 500 | — |
| 3 | 19 | >5.0 | 1.20 | 1.43 | 3.7 | 700 | 1550 | 0 | 1900 | — |
| 4 | 0 | 0.08 | (4) | — | 3.5 | 600 | 1650 | 0 | 2000 | — |
| 5 | 0 | 1.0 | 1.20 | 1.37 | 3.8 | 1100 | 1650 | 0 | 2000 | — |
| 6 | 0 | 0.06 | (4) | — | 3.9 | 200 | 1600 | 0 | 1900 | — |
| 7 | 5 | 0.65 | 1.22 | 1.42 | 3.9 | 1450 | 1750 | 0 | 2100 | — |
| 8 | 0 | 0.07 | (4) | — | 4.8 | 100 | 1600 | 0 | 1900 | — |
| 9 | 0 | 0.06 | (4) | — | 6.9 | 100 | 1550 | 0 | 1900 | — |
| 10 | 0 | 0.07 | 1.23 | 1.43 | 3.8 | 200 | 1700 | 0 | 2000 | — |
| 11 | 0 | 0.10 | 1.20 | 1.36 | 4.0 | 1300 | 1600 | 0 | 1900 | — |
| 12 | 2 | 0.80 | 1.19 | 1.35 | 3.5 | 800 | 1700 | 0 | 2050 | — |
| 13 | 0 | 0.09 | 1.19 | 1.38 | 3.6 | 100 | 1650 | 0 | 1900 | — |
| 14 | 0 | 0.09 | 1.21 | 1.42 | 4.0 | 1250 | 1550 | 0 | 1900 | — |
| 15 | 0 | 0.10 | 1.22 | 1.40 | 3.7 | 600 | 1700 | 0 | 2000 | — |
| 16 | (4) | — | 1.23 | 1.42 | 3.9 | 1000 | 1500 | 0 | 700 | — |
| 17 | 0 | 0.92 | 1.20 | 1.37 | 3.5 | 1100 | 1350 | 0 | 1700 | — |
| 18 | 3 | 1.25 | 1.21 | 1.39 | 3.6 | 750 | 950 | 0 | 700 | — |
| 19[3] | 50 | 1.0 | 1.65 | 2.00 | 3.5 | 1400 | 1600 | 1400 | 1400 | 200 |

[1]The forward blocking voltage at punch-through.
[2]dV/dt could not be measured because no measurable forward voltage was found.
[3]These are corresponding values for a typical prior art thyristor with a working part of about $2 \times 10^{17}$ per cm$^3$.
[4]Wouldn't fire.

As can be seen from Table I, the thyristors of the present invention had forward voltage drop lower than the typical prior thyristor, i.e. 1.21 v. 1.65 volts at 625 amps. The gate current to fire ($I_g$) was, however, also low. The gate current is thereafter increased to greater than 10 milliamps by selectively irradiating the gating portion of the devices as above described with 2 Mev electron radiation to a dosage of about $3 \times 10^{13}$ electrons/cm$^2$.

To demonstrate the gate current control, 10 regular 800 volt center fired thyristors were irradiated with the 2 Mev electron radiation to a dosage of about $3 \times 10^{13}$ electrons/cm$^2$. The first five devices were selectively irradiated with the conduction portions of the devices shielded with a lead mask. To provide a control, the second five devices were irradiated with the entire surface shielded with a lead mask. The electrical characteristics were then measured; they are shown in Table II.

TABLE II

| Run No. | $V_f^{(1)}$ Volts at 1500 amps | | $I_g$ Milliamps | | $V_g$ Volts | |
|---|---|---|---|---|---|---|
| | 0 | $3 \times 10^{13}$ e/cm² | 0 | $3 \times 10^{13}$ e/cm² | 0 | $3 \times 10^{13}$ e/cm² |
| 1 | 1.91 | 1.99 | 93 | 136 | 1.28 | 1.56 |
| 2 | 1.92 | 2.03 | 104 | 191 | 1.12 | 1.40 |
| 3 | 1.83 | 1.91 | 20 | 25 | 0.82 | .80 |
| 4 | 2.02 | 2.13 | 78 | 90 | 1.65 | 1.90 |
| 5 | 1.93 | 2.08 | 40 | 81 | 1.96 | 2.46 |
| 6 | 1.83 | 1.94 | 40 | 41 | 0.9 | .92 |
| 7 | 1.78 | 1.86 | 83 | 84 | 1.52 | 1.56 |
| 8 | 1.88 | 1.96 | 21 | 22 | .85 | .82 |
| 9 | 1.78 | 1.86 | 37 | 38 | .89 | .88 |
| 10 | 1.87 | 1.98 | 25 | 25 | .78 | .80 |

(1)All measurements were made at 25° C.

As shown by Table II, the gate current is substantially increased by irradiation. Thus, it is seen that radiation of the devices made in accordance with the present invention with a low forward voltage drop can be provided with a typical gate current to fire ($I_g$) by selective irradiation of the gating portions. Where low gate current to fire can be tolerated, irradiation is also expected to correct the $V_{BO}$ and dV/dt. However, where gate current to fire of greater than 10 milliamps is desired, heavy radiation dosages (i.e. $1 \times 10^{13}$ to $1 \times 10^{15}$ electrons/cm²) must be used. Therefore, other means must be provided to raise the $V_{BO}$ and dV/dt to acceptable values.

Figure 4:
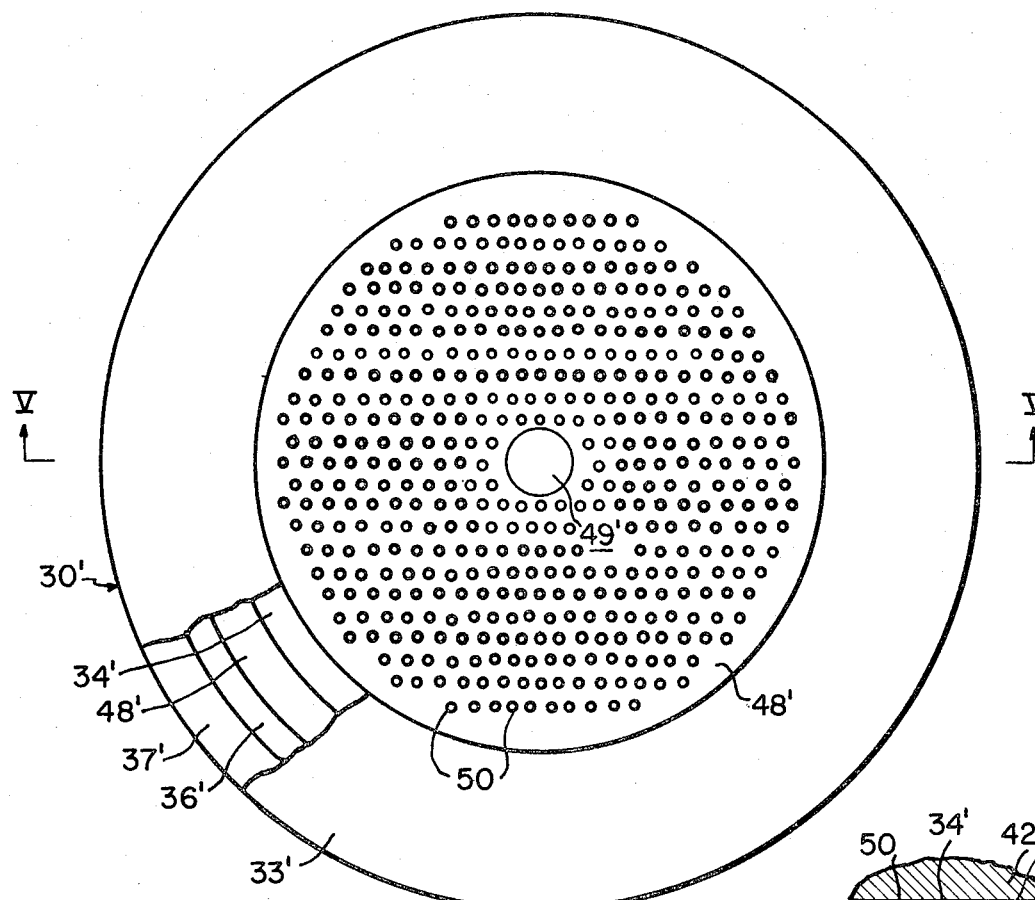
FIG. 4 is a top view of an alternative center fired thyristor, with shunts shown, in accordance with the present invention.
Figure 6:
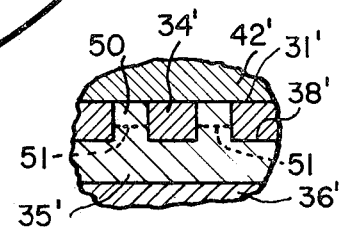
FIG. 6 is a fragmentary elevational view in cross-section taken along line IV—IV of FIG. 5.
Figure 5:
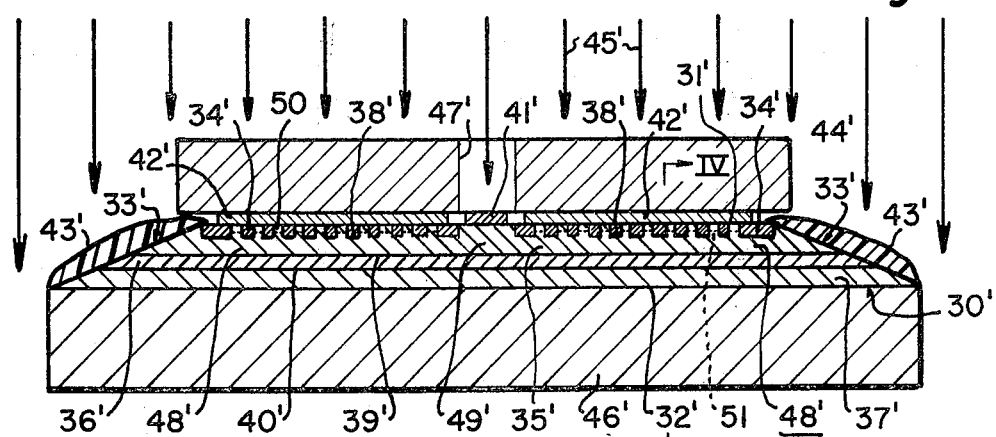
FIG. 5 is an elevational view in cross-section taken along line V—V of FIG. 4 with ohmic contacts and radiation shield shown.

Referring to FIGS. 4 and 5, an embodiment of the invention is shown in which a shunt pattern is provided to increase $V_{BO}$ and dV/dt. The center-fired thyristor has all of the elements as previously described in connection with FIG. 2, except as hereinafter described. For this reason, the corresponding elements are given prime numbers to those shown and described in connection with FIG. 2.

In this embodiment, portions of the conducting portions 48' of major surface 31' are photomasked prior to diffusion of the cathode-emitter region 34'. Thus, when cathode-emitter region 34' is formed, shunts 50 are formed. Thereafter, the photomask is removed and boron is diffused into the shunts 50 by standard techniques to a depth, shown by dotted lines 51, less than the depth of the cathode-emitter region. It should be noted that although a negative photomask may be appropriate in some instances for diffusion of the boron; such a photomask is generally not needed because the concentration of the boron is so much lower than the impurity concentration of the cathode emitter that significant compensation thereof does not occur.

The $V_{BO}$ and dV/dt can thus be controlled and increased to typical values while maintaining the forward voltage drop at a low value. At low current levels, shunts 50 through the cathode-emitter regions 34' will reduce the injection efficiency of the cathode emitter nearly to zero. At higher current levels, the voltage drop in the cathode base region between the shunts (i.e. the NPN transistor like section of the device) will bias the emitter junction sufficiently to cause minority carrier injection. By increasing the shunt area, the distance between the shunts will be decreased and $V_{BO}$ and dV/dt will be increased. However, the increase in shunt areas also causes an increase in forward voltage drop. Preferably, the resistance through the shunts is controlled by the shunt pattern and the diffusion into the shunts: The lateral resistance is controlled by the size of the spacing shunts; the vertical resistance is controlled by the impurity concentration in the shunts and the size of the shunts. The $V_{BO}$ and dV/dt are thus tailored for the particular embodiment without changing the forward voltage drop significantly. These adjustments can also cause the gate current to fire ($I_g$) to be increased without irradiation.

It should also be noted that in the embodiment shown in FIG. 5, the peripheral portion of the device is irradiated along with the gating portion. This increases the blocking voltage of the device without significantly increasing the forward voltage drop, see our application Ser. No. 283,684, filed Aug. 25, 1972 and now U.S. Pat. No. 3,872,493.

While presently preferred embodiments have been shown and described with particularity, it is distinctly understood that the invention may be otherwise variously performed within the scope of the following claims.

What is claimed is:

1. A thrystor comprising:
semiconductor body having disposed therein a cathode-base region with an impurity concentration at the working point below $5 \times 10^{15}$ per cm³ and having a gating portion and a conducting portion, said gating portion adjoining a major surface of the semiconductor body and having been irradiated with a radiation source to decrease gate sensitivity of the thyristor, and said conducting portion adjoining a cathode-emitter region and having been nonirradiated with said radiation source by masking said conducting portion against irradiation by said radiation source to maintain forward voltage drop of the device.

2. A thyristor as set forth in claim 1 wherein:
the gating portion is irradiated with electron radiation to an intensity greater than 1 Mev and a dosage greater than $1 \times 10^{13}$ electrons/cm².

3. A thyristor as set forth in claim 1 wherein:
the impurity concentration at the working point is below $1 \times 10^{15}$ per cm³.

4. A thyristor as set forth in claim 1 wherein:
said cathode-base region includes shunts through cathode-emitter regions to said major surface of said semiconductor body to control the $V_{BO}$ and dV/dt of the thyristor.

5. A thyristor as set forth in claim 2 wherein:
the impurity concentration at the working point is below $1 \times 10^{15}$ per cm³.

6. A thyristor as set forth in claim 2 wherein:
said cathode-base region includes shunts through cathode-emitter regions to said major surface of said semiconductor body to control the $V_{BO}$ and dV/dt of the thyristor.

* * * * *